United States Patent [19]

Miller et al.

[11] Patent Number: 5,099,392
[45] Date of Patent: Mar. 24, 1992

[54] TAPE-AUTOMATED BONDING FRAME ADAPTER SYSTEM

[75] Inventors: Michael C. Miller, Fremont; Hugh V. Plas, Palo Alto, both of Calif.

[73] Assignee: Hewlett-Packard Company, Palo Alto, Calif.

[21] Appl. No.: 502,887

[22] Filed: Apr. 2, 1990

[51] Int. Cl.$^5$ .............................................. H05K 7/02
[52] U.S. Cl. ................................... 361/400; 361/399; 357/75; 439/68; 439/74
[58] Field of Search ............... 174/250, 253, 255, 261, 174/268; 361/392, 393, 394, 395, 397, 398, 399, 400, 403, 404, 409, 417, 419, 420, 421; 439/44, 47, 49, 50, 68, 69, 74; 357/74, 75

[56] References Cited

U.S. PATENT DOCUMENTS

| | | | |
|---|---|---|---|
| 4,593,961 | 6/1986 | Cosmo | 439/66 |
| 4,658,331 | 4/1987 | Berg | 361/398 |
| 4,744,009 | 5/1988 | Grabbe et al. | 361/398 |
| 4,894,663 | 1/1990 | Urbish et al. | 361/398 |
| 4,894,706 | 1/1990 | Sato et al. | 357/74 |

FOREIGN PATENT DOCUMENTS

| | | | |
|---|---|---|---|
| 0182700 | 5/1986 | European Pat. Off. | |
| 0218495 | 4/1987 | European Pat. Off. | |
| 0025922 | 3/1988 | European Pat. Off. | |
| 0343864 | 11/1989 | European Pat. Off. | |
| 3701310 | 7/1988 | Fed. Rep. of Germany | |
| 0225654 | 12/1983 | Japan | 357/74 |
| 8304141 | 11/1983 | PCT Int'l Appl. | 357/75 |
| 608926 | 1/1979 | Switzerland | |

OTHER PUBLICATIONS

Product Brochure from AMP, Inc. dated Sep. 1, 1989: "Micro Interposer Socket".
"TAB Update" excerpt from SMT Trends, pp. 8-9.
"High Density Packaging Technology Ultra Tin Package And New Tab Package" by O. Nakagawa et al., published in Journal of Electronic Materials, vol. 18, No. 5, pp. 633-643, 1989.
"Getting Started in TAB", by S. Banks, published in Surface Mount Technology, Aug. 1989, pp. 42-45.
"COB and TAB: Evaluating The New Assembly Technologies" by D. Feindel, published in Surface Mount Technology, Aug. 1989, pp. 47-50.
Product Brochure from Motorola, Inc.: "MCA100-00ECL Macrocell Array".
"Multi-Chip Packaging From Digital".
"Interconnecting Multichip ICs in a Plastic Package" by Larry Hobson, published in Electronic Packaging & Production, Oct. 1989, p. 58 et seq.

Primary Examiner—Leo P. Picard
Assistant Examiner—Donald A. Sparks

[57] ABSTRACT

A Tape-Automated Bonding (TAB) Frame Adapter System for providing an interface to a device having a plurality of closely spaced leads is disclosed. The preferred embodiment of the invention comprises a dielectric rectilinear adapter ring or platform that includes upper and lower surfaces. Four sidebars enclose a central aperture. Each pair of sidebars terminates in a corner junction which protrudes away from the central aperture. The sidebars bear rows of conductors which register with high density leads on the periphery of a TAB frame and a printed circuit board. Each corner junction is designed to include a through-hole, which is surrounded by a metal insert, and an alignment pin. The adapter ring is a critical element of a novel TAB assembly comprising a TAB frame bearing a chip, an elastomer, a lid, and a PC board. A set of screws fit in a set of holes in a lid and in a PC board to hold the entire assembly in compression. The conductors which form the interface are either metal strips that are draped over the adapter ring or protruding members which are embedded in slots formed in the adapter ring. The conductors are deployed in two interleaved rows, one along the edge closest to the central aperture, and another on the opposite edge. Any adjacent pair of draped conductors is affixed to the top surface of the adapter ring so that the lower portions of the pair are pointed in opposite parallel directions.

18 Claims, 9 Drawing Sheets

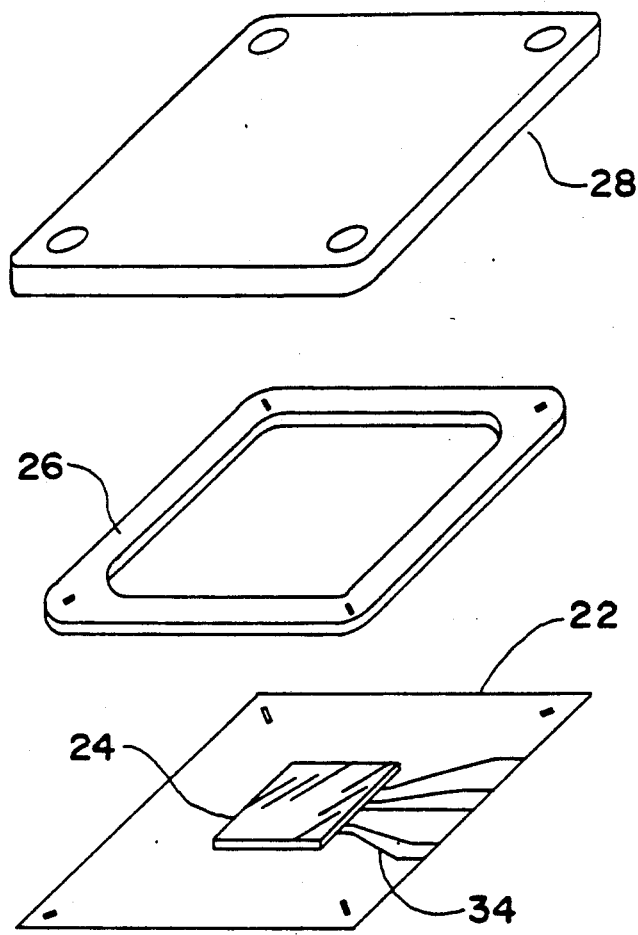
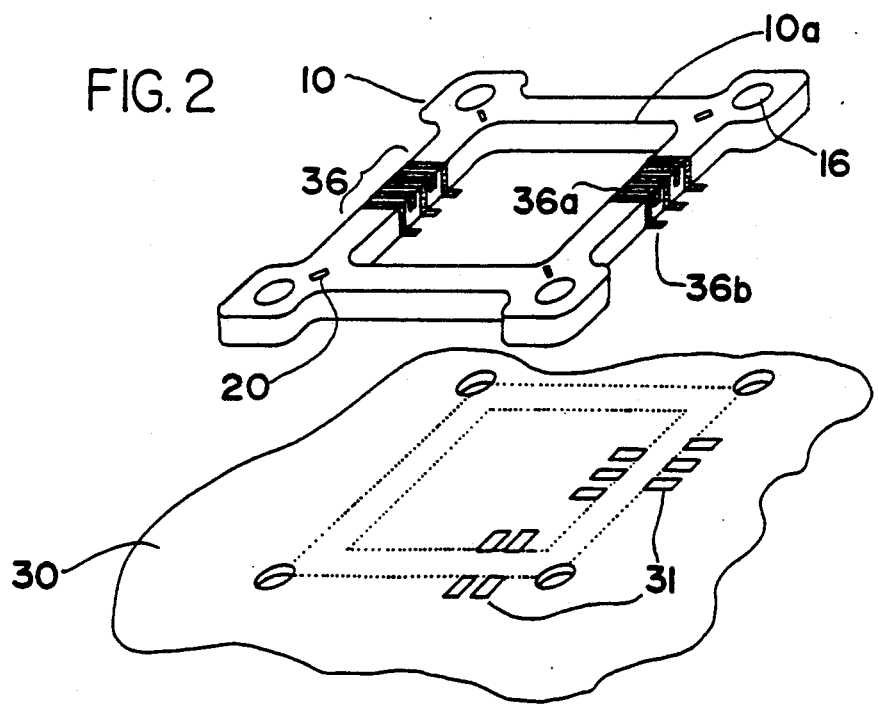
FIG. 2

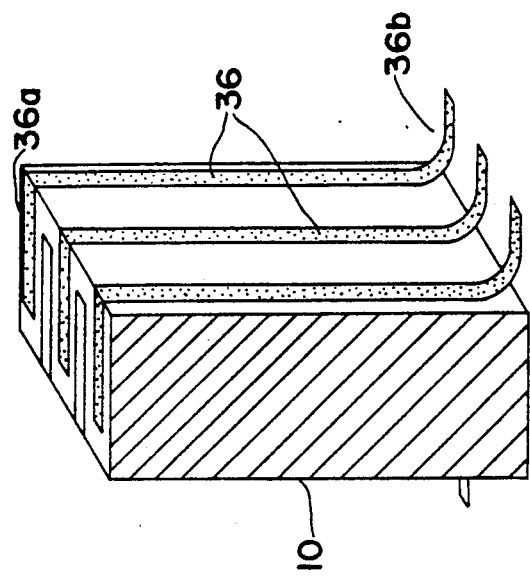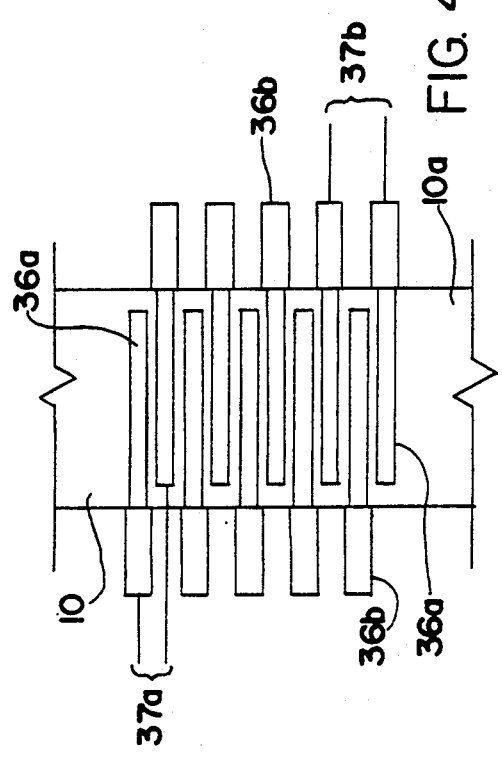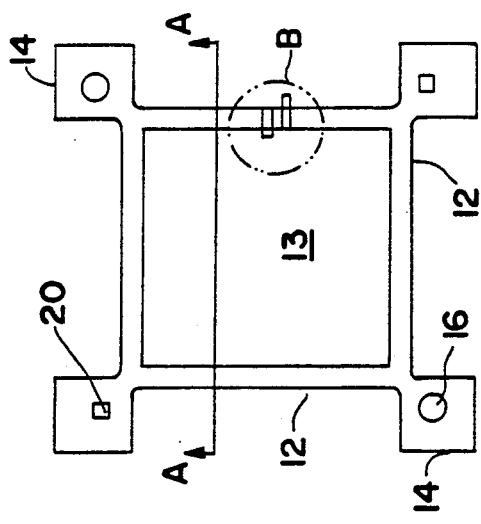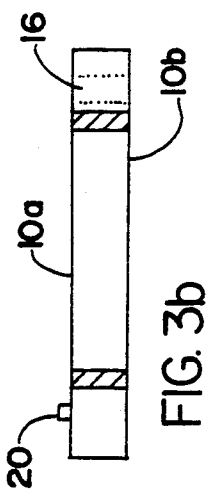

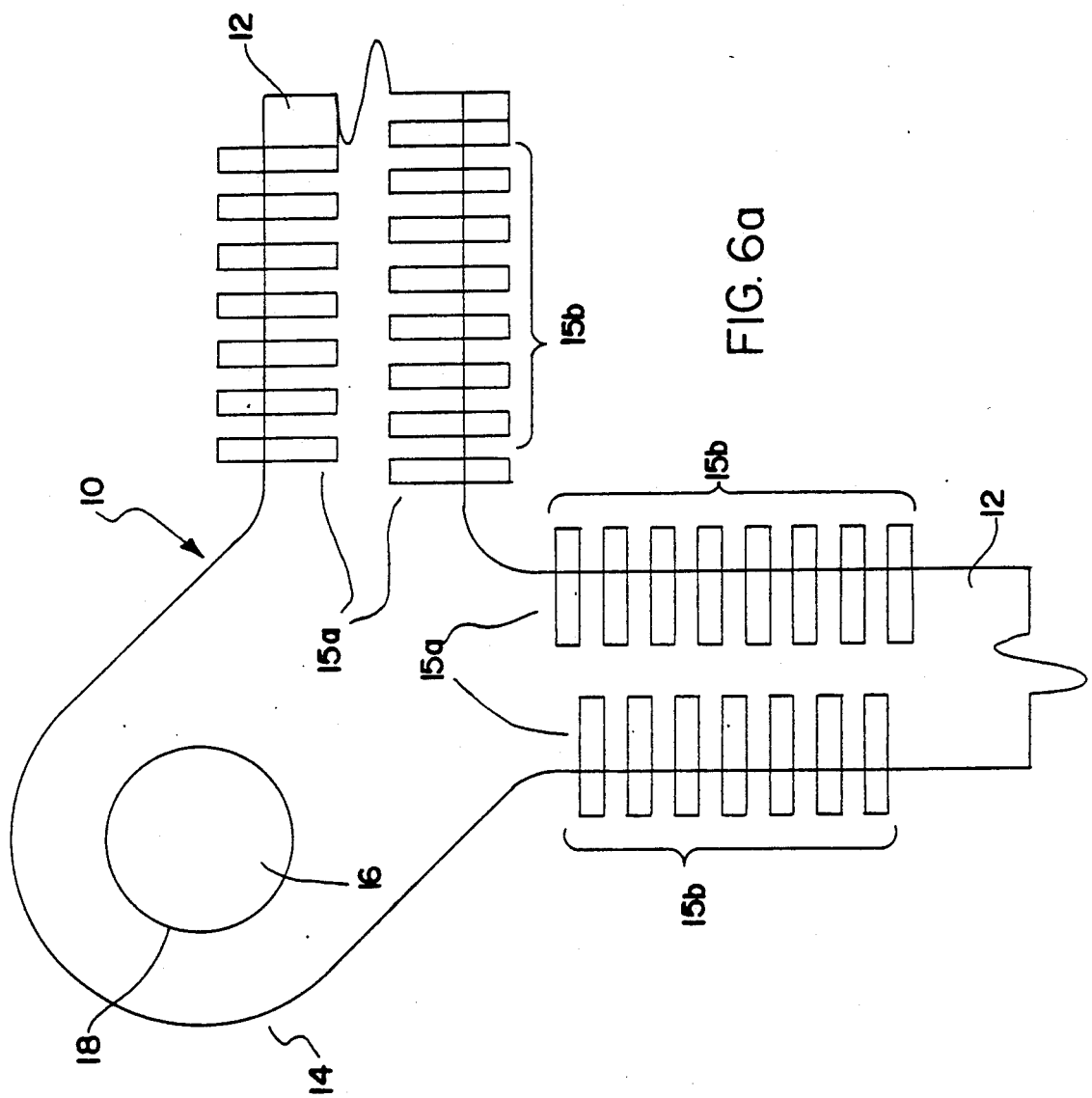

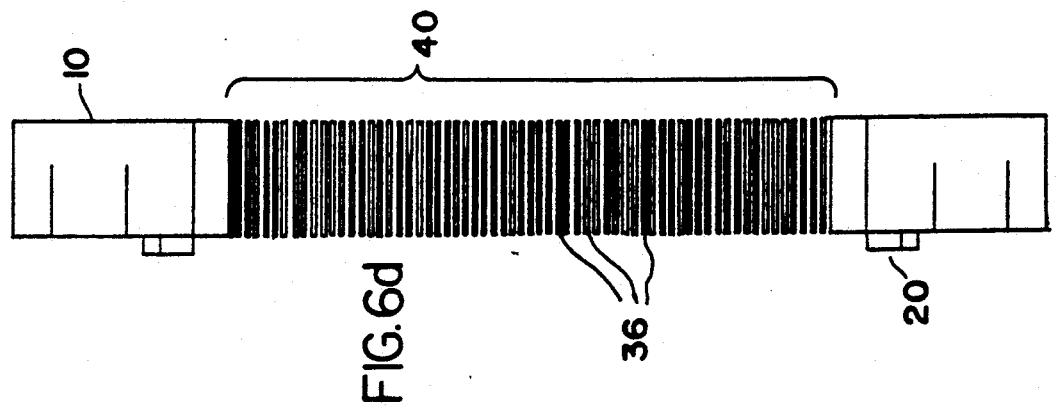
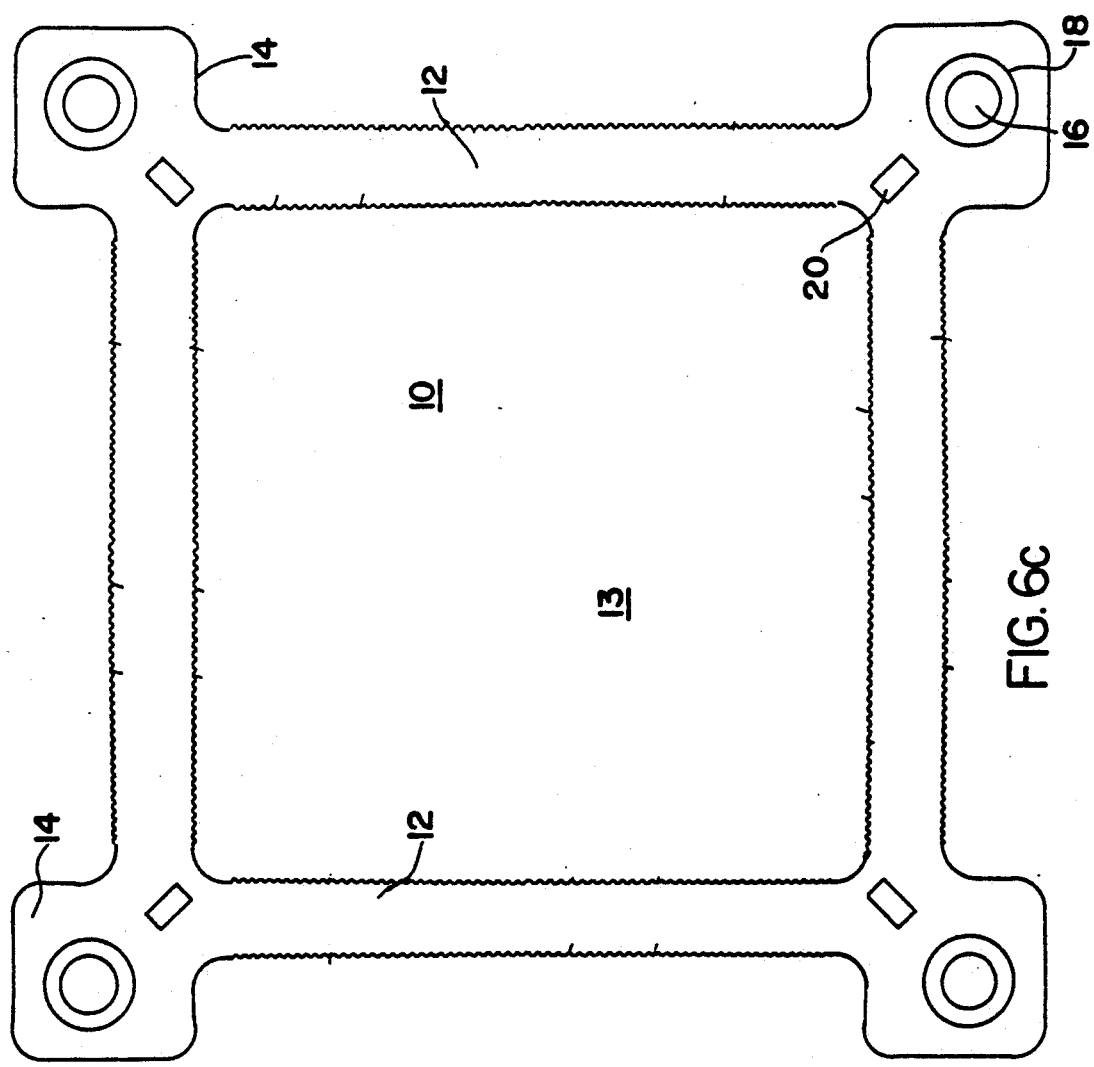

TAPE-AUTOMATED BONDING FRAME ADAPTER SYSTEM

BACKGROUND OF THE INVENTION

The present invention includes methods and apparatus for making connections to an integrated circuit chip. The Tape-Automated Bonding Frame Adapter System provides a versatile and reliable device that provides increased lead density in a simplified and cost-effective package design.

Each year integrated circuits become more powerful and capable of storing more information. One of greatest challenges confronting designers in the electronics industry is finding more efficient and reliable methods to access the complex circuitry that resides within the chip package. A large rectangular IC chip having sides less than one half inch in length may have as many as five hundred or more leads extending from it. Each of these conductors must be physically bonded or coupled to external devices.

The basic methods of packaging integrated circuit chips utilize a technique called "tape-automated bonding." This fabrication procedure is commonly referred to by the acronym "TAB" and is well known to persons ordinarily skilled in the electronics packaging art. A continuous insulative tape which is similar to photographic film provides a basis for chips that are mounted on individual sections or frames of the tape. Sections or frames of TAB tape are generally rectangular or square sections that are arranged side-by-side along an uncut tape. A spider-like metal pattern of conductive traces is formed on each frame. The traces radiate from the center of the frame to its four edges. A chip is attached to the center of the TAB frame, so that the leads or contacts of the chip are mated with the corresponding metal traces in the central portion of the TAB frame. The resulting assembly comprising the chip, the TAB frame, and the substrate is essentially a space transformer that employs diverging radial electrical pathways to afford ready access to the integrated circuit.

Even this advanced TAB technology, however, is limited by the interface at the surface of the printed circuit board on which it resides. Conventional TAB devices require finely spaced or "pitched" patterns of metal pads on the printed circuit board. The problem of providing a high-density TAB assembly that is compatible with standard surface mount devices has presented a major challenge to designers in the automated electronic packaging field. The development of a rugged, precisely-aligned, and versatile system that does not suffer from the obstacles encountered during the manufacture of conventional TAB hardware would constitute a major technological advance in the electronics business. The enhanced performance that could be achieved using such an innovative device would satisfy a long felt need within the industry and would enable electronic equipment manufacturers to save substantial expenditures of time and money.

SUMMARY OF THE INVENTION

The Tape-Automated Bonding Frame Adapter System disclosed and claimed in this patent application solves the problems encountered by conventional TAB devices. The present invention is a space transformer that provides a reliable interface between the high density pitch of leads on a TAB frame to the lower toleranced dimensions of standard surface mount printed circuit boards. The invention doubles the effective lead pitch supported by standard surface mount boards, eliminates the need for any expensive selective plating on the printed circuit board and allows standard surface mount boards and processes to be used during the manufacturing process.

The preferred embodiment of the invention comprises a dielectric adapter ring or platform that serves as a precisely aligned electrical coupling between a TAB frame and a printed circuit board. A quadrilateral platform includes four sidebars that are joined by four corner junctions which surround a central aperture. Each sidebar bears one or two rows of interleaved conductors which allow tightly spaced leads on a TAB frame to be routed to more widely spaced conductive traces on a printed circuit board. The adapter is the critical element of demountable TAB assembly that is held together in compression by screws that pass through a lid, a cushion of elastomer material, and a PC board.

The conductors which form the bridge from the outside leads of the TAB frame to the substrate board are metallic elements that are draped over the insulative platform. An alternative embodiment utilizes conductors that are embedded in slots or recesses in the adapter ring.

The present invention is a high performance chip interface device that addresses the troublesome fabrication difficulties posed by conventional TAB hardware. The invention not only surmounts the manufacturing impediments explained above in the background section, but also improves the performance of the entire assembly, as described in detail below. This innovative method and apparatus provide an effective and efficient tool that will enable manufacturers of electronic equipment to create high quality products that will benefit a wide variety of consumers of the electronic and computer systems.

An appreciation of other aims and objectives of the present invention and a more complete and comprehensive understanding of this invention may be achieved by studying the following description of a preferred embodiment and by referring to the accompanying drawings.

BRIEF DESCRIPTION OF THE DRAWINGS

FIG. 2 is an exploded view of a second embodiment of the invention which includes draped, as opposed to embedded, conductive interfaces.

FIG. 3(a) and 3(b) present side and top schematic views of an embodiment of the adapter ring 10 that incorporates rectilinear corner junctions.

FIG. 4 reveals a magnified view of circular Section B in FIG. 3(a).

FIG. 5 supplies a perspective view of a section of the adapter platform bearing draped metallic strips.

FIG. 6(a) is an enlarged top view of an adapter ring that supports two rows of embedded conductors.

FIG. 6(c) exhibits a top schematic depiction of an entire adapter bearing a pattern of peripheral slots and ribs.

FIG. 6(d) provides a corresponding schematic side view.

DETAILED DESCRIPTION OF A PREFERRED EMBODIMENT

Figure 1B:
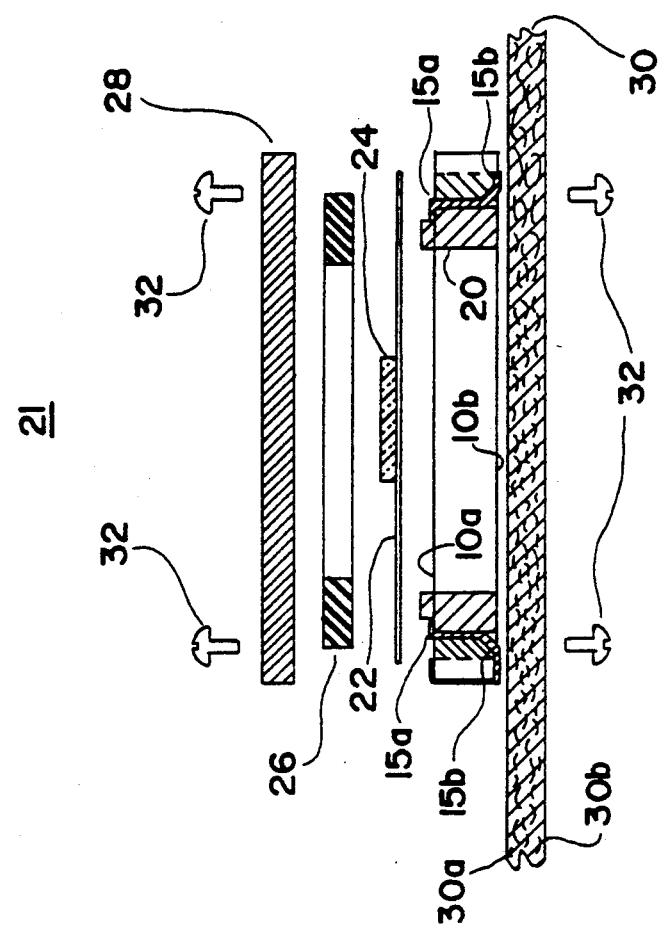
FIG. 1(b) is a side view taken along Axis A in FIG. 1(a) that depicts the present invention in its working environment along with a printed circuit board, a TAB frame, an elastomer, and a clamping lid.
Figure 1A:
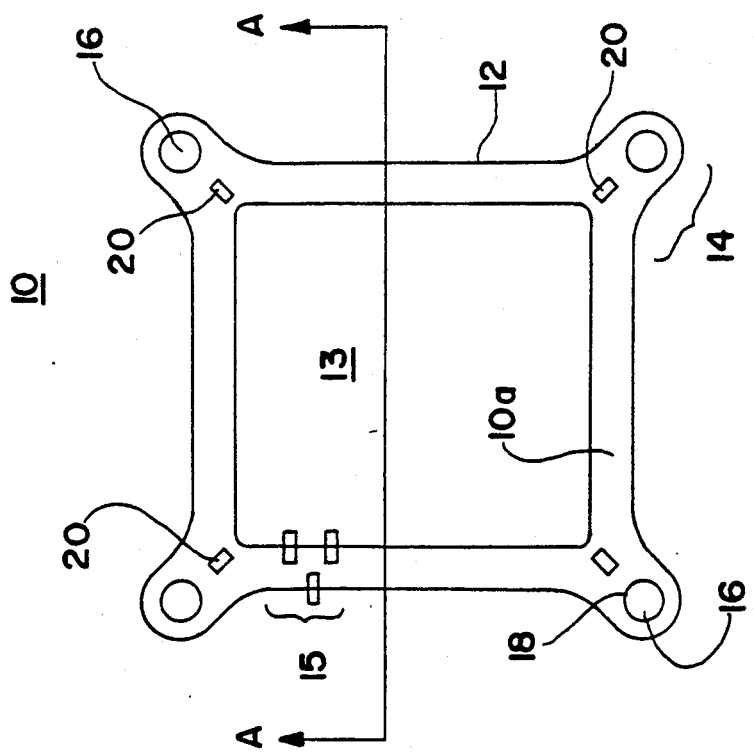
FIG. 1(a) is a top view of the basic quadrilateral embodiment of the adapter ring that includes four sidebars surrounding a central aperture.

FIG. 1(a) illustrates the basic quadrilateral embodiment of a dielectric adapter ring or platform 10 that includes upper and lower surfaces 10a and 10b (FIG. 1b). Four sidebars 12 enclose a central aperture 13. Each pair of sidebars 12 terminates in a corner junction 14 which protrudes away from central aperture 13. The sidebars 12 bear rows of conductors 15 which register with conductive traces on a TAB frame and a printed circuit board (not shown in FIG. 1). Each corner junction 14 is designed to include a through-hole 16 which is surrounded by a metal insert 18 and an alignment pin 20. Although the embodiments of the adapter ring 10 which are portrayed in the drawings and described in this specification are all rectilinear, any geometrical configuration which accomplishes the design objectives stated below could be employed.

FIG. 1(b) is an exploded side view showing adapter ring 10 along Axis A of FIG. 1(a). This drawing depicts the present invention in the context of a working assembly 21 comprising a TAB frame 22, a chip 24, an elastomer ring 26, a lid 28, and a printed circuit board 30. A set of screws 32 fit through holes in lid 28 and into adapter ring 10 to hold the entire assembly 21 in compression. The conductors 15 exhibited in FIG. 1(b) are metallic elements that are embedded in slots or recesses in the adapter ring 10. The top portions 15a of the conductors 15 are precisely aligned with corresponding conductive traces on the TAB frame 22 that is positioned above the adapter ring 10. The bottom or lower portions 15b of the conductors 15 are similarly mated with signal pathways located on the printed circuit board 30. The conductors 15 are arranged so that any two adjacent conductors are generally centered over opposite lateral edges of a sidebar 12 of the adapter ring 10. The conductors are deployed in two rows, one along the edge closest to central aperture 13, and another on the opposite edge. When this pattern is employed, the invention provides optimal spacing between conductors on the PC board 30 for a given lead density on the TAB frame 22. A method of forming the embedded conductors 15 portrayed in FIG. 1(b) are shown in detail in FIGS. 7, 8, and 9.

FIG. 2 is an exploded perspective view of a second embodiment of the invention which employs draped, rather than embedded, conductors. Throughout the specification, various alternative forms of conductive interfaces which may be utilized in the present invention are identified by the reference numerals "15" and "36". In general, the numeral "15" indicates an embedded conductor which protrudes from the adapter ring 10, while the numeral "36" refers to conductive elements that drape over or are somehow attached to the adapter ring 10. In the claims, the phrase "conductor means" is directed to all the embodiments presented in the specification. One form of these draped conductors 36 is best viewed in FIG. 2, which also depicts the upper and lower portions 36a and 36b of these conductors. The upper portion 36a of each conductor 36 lies over upper surface 10a of the adapter ring, and is aligned so that it will contact its corresponding trace 34 on the TAB frame 22 which resides above the adapter ring 10 in assembly 21. The lower portion 36b of each conductor 36 is designed to mate with matching conductive trace 31 shown on circuit board 30. Like the embedded conductors 15 shown in FIGS. 1(a) and 1(b), the draped conductors 36 are interleaved or staggered to provide an enhanced space transformer to TAB tape frame 22. Any adjacent pair of draped conductors 36 is affixed to the top surface 10a of the adapter ring 10 so that the lower portions 36b of the pair are pointed in opposite parallel directions. This arrangement supplies a relatively large span between the lower portions 36b of successive conductors lying on top of the circuit board 30 on either side of the adapter ring 10.

FIGS. 3(a) and 3(b) present top and side schematic views of an embodiment of the adapter ring 10 that utilizes rectilinear corner junctions 14. FIG. 3(a) includes a pair of square locating pins 20 for matching sprocket holes (not shown) on the TAB frame 22. The round holes 16 are positioned to receive screws 32 that pass through the TAB lid 28 best pictured in FIG. 1(b). FIG. 3(b) shows the side view of the ring 10 taken along Axis A of FIG. 3(a).

FIG. 4 reveals a magnified view of Section B in FIG. 3(a). An alternating pattern of draped conductors 36 are shown extending across the upper surface 10a of the adapter ring. Conductive traces on the substrate board 30 below the adapter ring 10 radiate away from the lower portions 36b of conductors 36 that are aligned over them. The distances marked by reference numerals "37a" and "37b" indicate the effective TAB tape pitch provided by the adapter ring 10 in this configuration. The present invention can deliver an immediate 100% improvement in lead-spacing ratio, i.e., 37b/37a, compared to older TAB hardware. While currently available PCB products normally use a 0.025 inch lead pitch, the TAB Frame Adapter System supplies twice the density, allowing the use of 0.0125 inch lead pitch TAB packages.

FIG. 5 supplies a perspective side view of a small section of the adapter ring 10. The conductors 36 in this embodiment are thin metallic strips that can be affixed to the adapter ring 10 by embedding during molding or by using a suitable mechanical fastener.

Figure 6B:
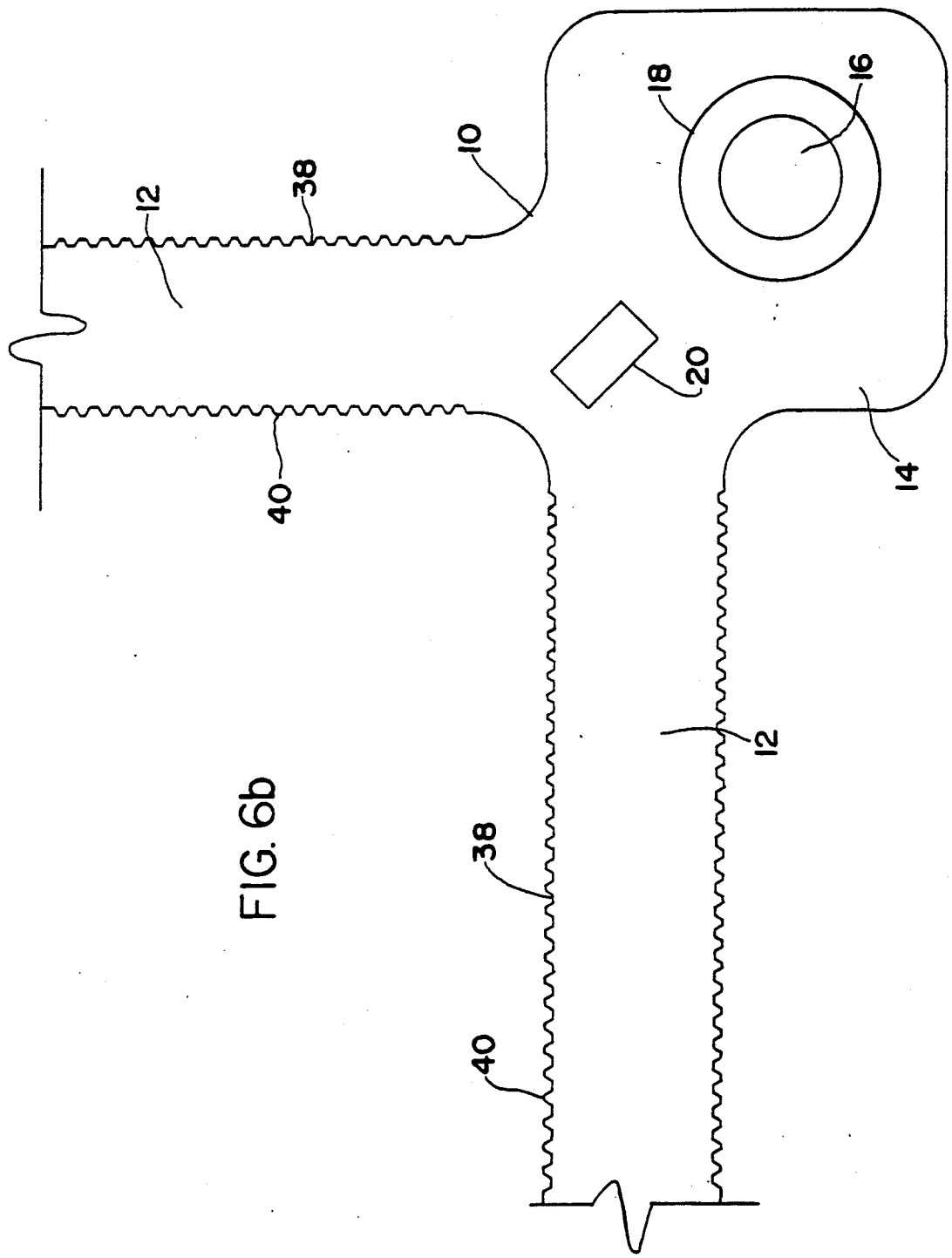
FIG. 6(b) shows another version of the platform which is capable of receiving draped strips in slots formed at the periphery of each sidebar.

An example of one embodiment of this invention is shown in FIG. 6. FIG. 6(a) is an enlarged top view of one of the corner junctions 14 of an adapter ring 10 that supports two rows of embedded conductors 15. The width of each sidebar 12 on the adapter platform 10 is 0.26 inches. The length of each sidebar, which also equals the shortest distance across the central aperture 13, is 1.15 inches. The center-to-center distance between two holes 16 on opposite ends of any sidebar 12 is 1.5 inches. Each conductor 15 is 0.080 inches long and the center-to-center distance of adjacent pairs of conductors is 0.025 inches. Each conductor extends beyond the edge of the sidebar on which it resides by 0.030 inches. FIG. 6(b) shows another version of platform 10 which is capable of receiving conductive draped strips 36 in slots 38 formed at the periphery of each sidebar 12. Each slot or channel 38 is 0.010 inches wide and is defined by two ribs 40 that measure 0.015 inches wide and extend 0.005 inches from the sidebar 12. The pitch or center-to-center distance between successive ribs is 0.025 inches. This drawing also depicts an alignment pin 20 having the dimensions of 0.075 by 0.040 inches. The pin 20 is located within the corner junction area 14 on a line from the center of its adjacent through-hole 16 to the center of square aperture 13, and is therefore inclined 45 degrees to the axes of the two the sidebars 12 that lie on either side of pin 20. FIG. 6(c) is a top schematic illustration of an entire adapter ring 10 bearing this pattern of peripheral slots 38 and ribs 40. FIG. 6(d) provides a corresponding schematic side view.

Figure 7:
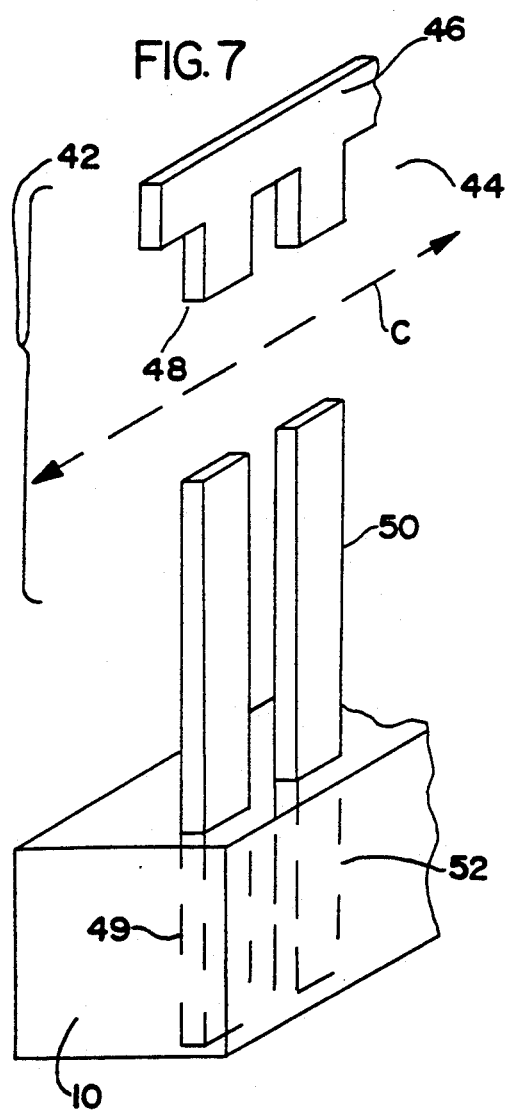
FIGS. 7, 8, and 9 portray one process for fabricating embedded conductors.
Figure 8:
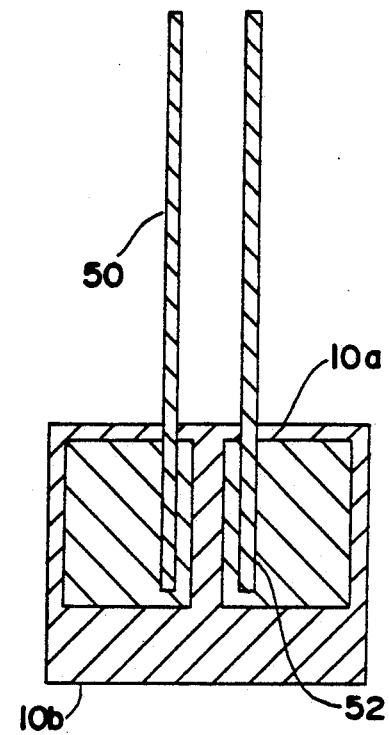
Figure 9:
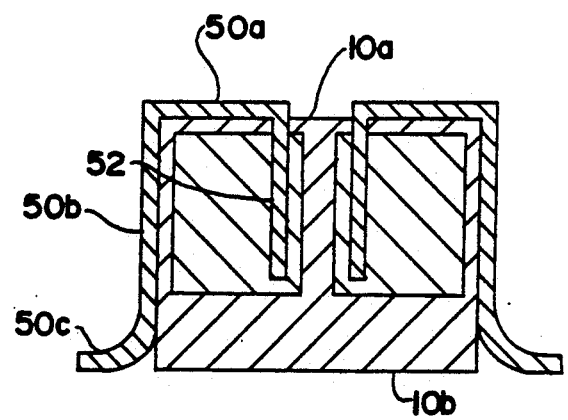

FIGS. 7, 8, and 9 portray the fabrication process for forming embedded conductors 15. A metal leader frame 42 having an upper portion 44 that includes a rail 46 and vertical bars 48 is installed in adapter ring 10, as revealed in perspective view in FIG. 7. After the leader frame 42 is molded within recesses 49 in the adapter ring 10, the upper portion 44 is sheared away along line C. This operation leaves the lower part of the leader frame 42 engaged by the adapter ring 10. These conductive members, which are shown by the cross-sectional view in FIG. 8, each comprise two sections, an upper section 50 which protrudes from the adapter ring 10, and a lower embedded section 52 which resides within the adapter ring. The protruding section 50 of each member is then bent three times to form each lead: an upper segment 50a which lies across the top surface 10a of the adapter ring 10, a side segment 50b, and a PC board coupler segment 50c is generally coplanar with lower surface 10b and which mates with a conductive trace 31 on the board 30 below the adapter ring 10 in assembly 21 (See FIG. 2).

Figure 11:
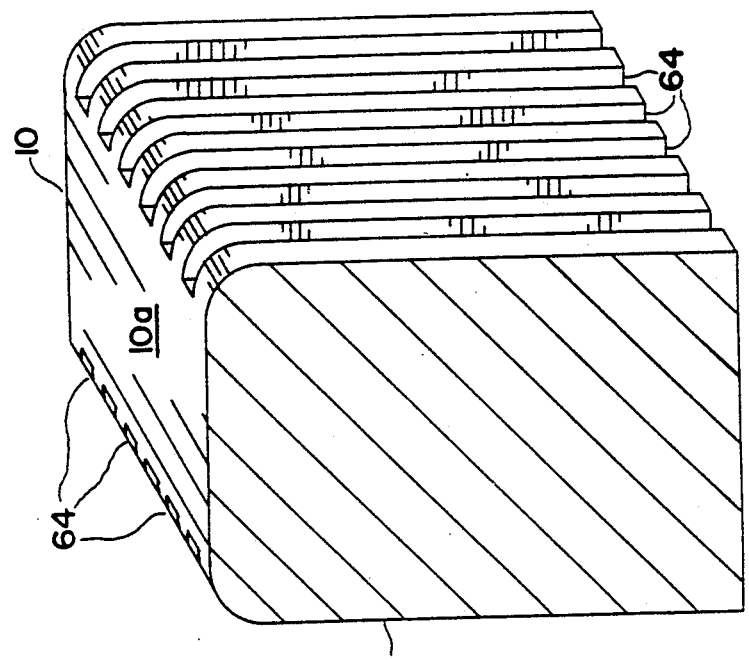
FIG. 11 reveals a section of the platform which receives the apparatus shown pictured in FIG. 10.
Figure 10:
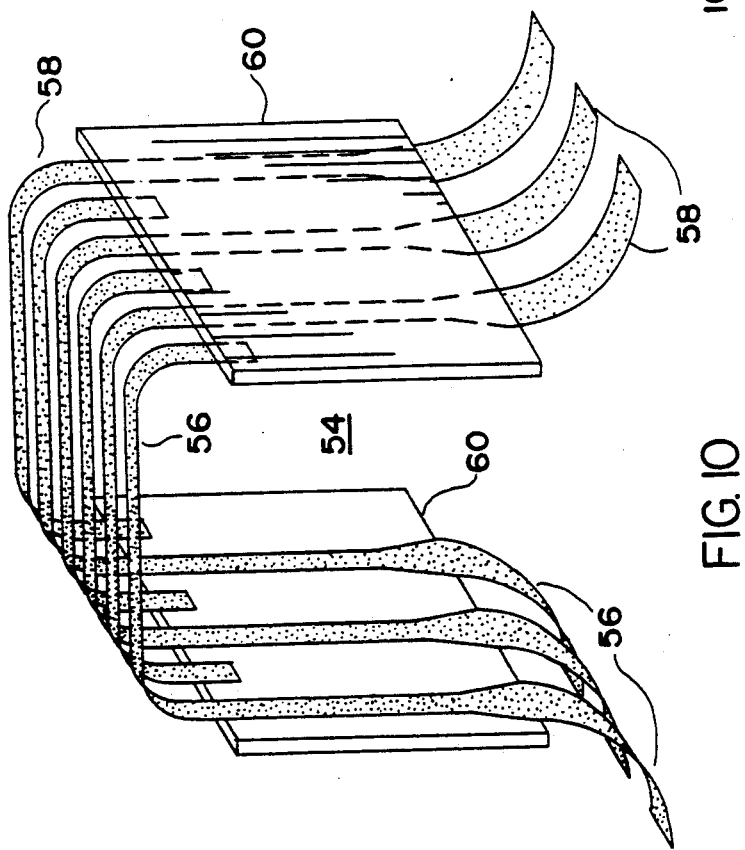
FIG. 10 is a perspective view of an apparatus that may be employed to manufacture the invention.

FIG. 10 is a perspective schematic view of a sub-assembly 54 that may be employed to manufacture the invention. Thin conductors 56 and 58 are interleaved and held by two polyimide keepers 60. The sub-assembly 54 is placed over the adapter 10, which is seen in FIG. 11. The narrow upper portion of each strip 56 and 58 lies across the upper surface 10a of the platform 10 and fits into a 0.010 inch groove 64 formed along the side of the adapter 10. The wider lower portion of each strip is twelve to fifteen mils across and is plated with solder so each strip can be easily joined to a conductive trace 31 on a substrate board 30. In this embodiment, the adapter section is fabricated from Ryton plastic and measures 0.200 inches high and 0.135 inches across.

Figure 12:
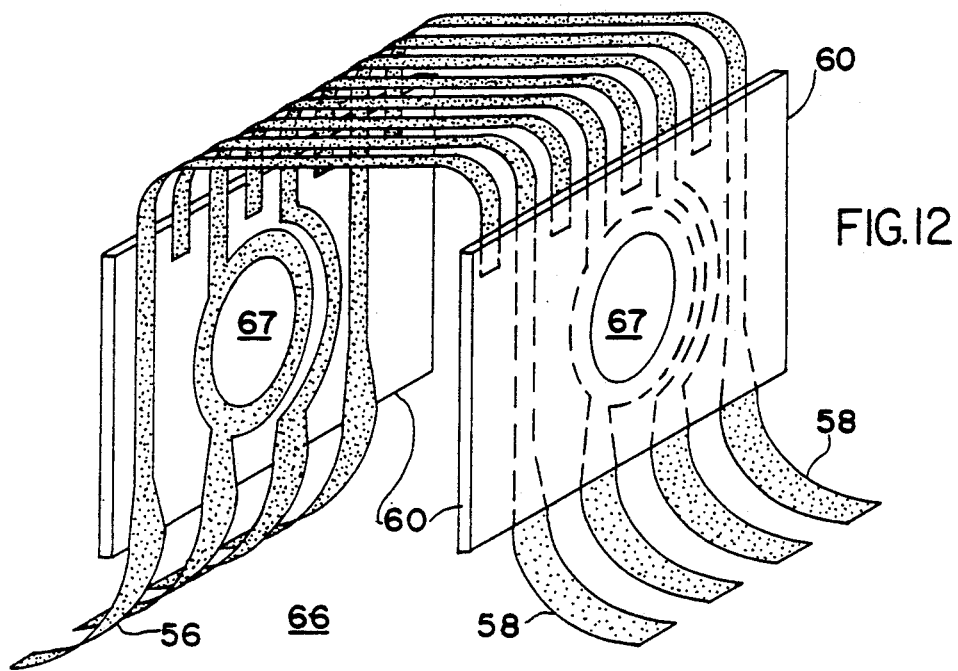
FIGS. 12 and 13 illustrate enhanced version of the sub-assembly and platform section shown in FIGS. 10 and 11.
Figure 13:
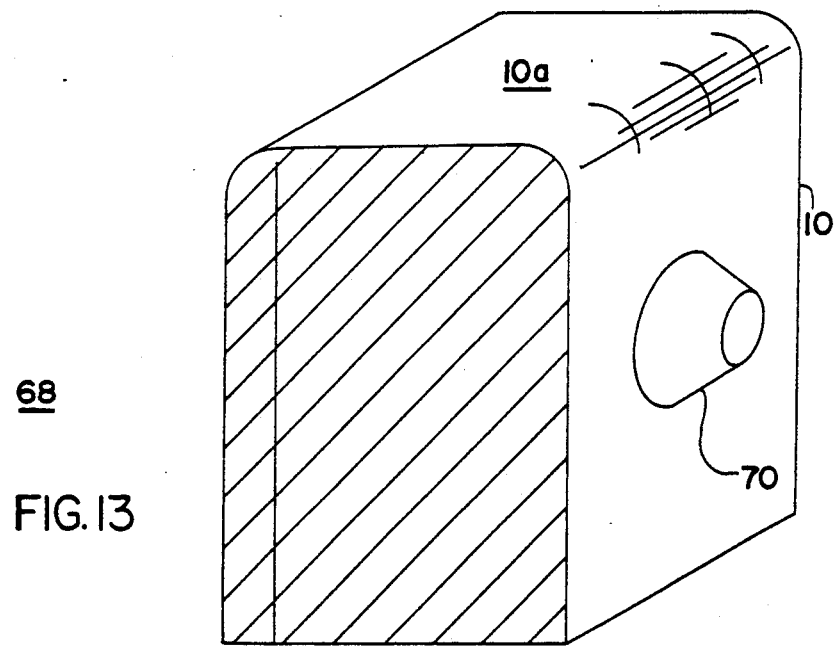

An enhanced version 54 of the sub-assembly shown in FIG. 10 appears in FIG. 12. In this alternative embodiment, each keeper 60 bears an aperture 67 which fits over a locating nipple 70 formed on the side of platform section 68, which is pictured in FIG. 13. The locating nipple 70 is then melted or riveted over the conductors 56 and 58 to retain the sub-assembly 54 on the adapter ring 10.

The TAB Frame Adapter System solves several problems which plague conventional TAB hardware. The present invention reduces the need for custom equipment and tooling and enhances the ease of assembly and repair of TAB packages. The invention also eliminates the need for expensive gold plated pads and precision-drilled holes on the PC board. Standard surface mount fabrication techniques can be used to assemble the components incorporated in the present invention. The present invention also enables designers of TAB assemblies to minimize and to isolate the use of exotic and expensive plated metals like gold. The content of gold in a solder joint on a PC board is an important design constraint because too much gold can lead to the mechanical failure of the joint. Joints that contain less than 0.5 weight-percent gold are considered safe for surface mount applications, and the configuration of the present invention totally eliminates the use of gold in the solder joints.

The TAB Frame Adapter System disclosed and claimed in this patent application constitutes a major step forward in the electronics packaging art and will provide a valuable tool for designers and manufacturers of electronic systems.

Although the present invention has been described in detail with reference to a particular preferred embodiment, persons possessing ordinary skill in the art to which this invention pertains will appreciate that various modifications and enhancements may be made without departing from the spirit and scope of the claims that follow.

LIST OF REFERENCE NUMERALS

FIG. 1(a)
 10 Quadrilateral dielectric platform
 12 Sidebar
 13 Central aperture
 14 Corner junction
 15 Embedded conductors
  15a Upper portion
  15b Lower portion
 16 Through-hole
 18 Threaded metal insert
 20 Alignment pins
FIG. 1(b)
 21 Demountable TAB Frame Adapter System
 22 TAB frame
 24 Chip
 26 Elastomer
 28 Lid
 30 Printed circuit board
 31 Conductive trace on PCB
 32 Screws
FIG. 2
 34 Leads on TAB frame
 36 Draped conductor strips
  36a Upper portion
  36b Lower portion
FIG. 4
 37 Effective TAB tape pitch distance
FIG. 6
 38 Slot for draped conductor strip
 40 Ribs defining slots
FIGS. 7 and 8
 42 Leader frame
 44 Upper portion of leader frame after separation
 46 Rail
 48 Vertical bar
 49 Recess in adapter platform
 50 Protruding section of embedded conductor
 52 Embedded section of conductor
FIG. 9
 50a Upper segment of embedded conductor
 50b Side segment of embedded conductor
 50c PC Board Coupler segment of embedded conductor
FIG. 10

54 Draped conductive strip sub-assembly with polyimide keeper
56 First set of conductive strips
58 Second set of conductive strips
60 Keeper

FIG. 11

62 Section of adapter platform with staggered grooves
64 Grooves

FIG. 12

66 Draped conductive strip sub-assembly with locating nipple and keeper aperture
67 Aperture

FIG. 13

68 Section of adapter platform with locating nipple
70 Locating nipple

What is claimed is:

1. An apparatus comprising:
an adapter ring means for providing support; said adapter ring means having an upper surface and a lower surface;
a plurality of conductor means for supplying electrical coupling; said plurality of conductor means being mechanically coupled to said adapter ring means; each of said conductor means having an upper portion and a lower portion;
each of said conductor means being a metal member which is partially embedded in said adapter ring means through said upper surface of said adapter ring;
a planar means for carrying an integrated circuit; said planar means being located above said upper surface of said adapter ring means;
a lid means for distributing clamping force;
an elastomer means for providing cushioning; said elastomer means being located between said planar means and said lid means;
a dielectric substrate means for providing an interface to an external device; said dielectric substrate means having an upper surface and a lower surface; said upper surface including a plurality of conductive traces;
said adapter ring means being affixed to said dielectric substrate means so that said lower portion of each of said conductor means mates with one of said conductive traces on said upper surface of said dielectric means;
said adapter ring means including a set of four sidebars;
said adapter ring means having a central aperture defined by said set of four side bars;
each of said metal members being embedded in one of said sidebars;
said metal members being deployed in a first and a second row, said first row located along an edge closest to said central aperture, and said second row located on an opposite edge of said sidebar; and
said metal members being arranged in a pattern in which any two of said members having upper portions which are adjacent on a sidebar have lower portions which extend down opposing sides of the sidebar.

2. An apparatus comprising:
an adapter ring means for providing support; said adapter ring means having an upper surface and a lower surface;
a plurality of conductor means for supplying electrical coupling; said plurality of conductor means being mechanically coupled to said adapter ring means; each of said conductor means having an upper portion and a lower portion;
each of said conductor means being a metal strip which is draped over and affixed to said adapter ring means;
a planar means for carrying an integrated circuit; said planar means being located above said upper surface of said adapter ring means;
a lid means for distributing clamping force;
an elastomer means for providing cushioning; said elastomer means being located between said planar means and said lid means;
a dielectric substrate means for providing an interface to an external device; said dielectric substrate means having an upper surface and a lower surface; said upper surface including a plurality of conductive traces;
said adapter ring means being affixed to said dielectric substrate means so that said lower portion of each of said conductor means mates with one of said conductive traces on said upper surface of said dielectric means; and
said conductor means being arranged in an interleaved pattern in which adjacent pairs of said lower portions extend in opposite parallel directions.

3. An apparatus comprising:
an adapter ring means for providing support; said adapter ring means having an upper surface and a lower surface;
a plurality of conductor means for supplying electrical coupling; said plurality of conductor means being mechanically coupled to said adapter ring means; each of said conductor means having an upper portion and a lower portion;
a TAB frame having a plurality of leads;
the upper portion of each of said plurality of conductor means being disposed normal to the perimeter across said adapter ring upper surface and located in correspondence with leads of the TAB frame;
said conductor means being arranged in an interleaved pattern in which adjacent pairs of said lower portions extend in opposite directions generally parallel to the adapter ring lower surface; and
a securing and pressure means for maintaining a contact force required to ensure electrical contact between said plurality of conductor means and the TAB frame leads.

4. An apparatus as in claim 3, including a keeper means for maintaining the upper portion of each of said plurality of conductor means disposed normal to the perimeter across said adapter ring upper surface.

5. An apparatus as in claim 4, in which said keeper means is mechanically interlocked with said adapter ring means.

6. An apparatus as in claim 3, in which said lower portion of said plurality of conductor means is solder plated.

7. An apparatus as in claim 3, wherein said plurality of conductor means comprises flexible circuitry.

8. An apparatus as in claim 3, wherein said adapter ring includes contact passages extending from said upper surface to said lower surface; and each of said plurality of conductor means is located within one of said contact passages.

9. An apparatus as in claim 8, wherein said plurality of conductor means comprises flexible circuitry.

10. An apparatus as in claim 5, wherein said plurality of conductor means comprises flexible circuitry.

11. An apparatus for making electrical contact with a TAB frame having a plurality of leads, the apparatus comprising:
- an adapter ring having inner and outer lateral sides and a generally planar surface for receiving a TAB frame;
- a plurality of conductors disposed normal to the perimeter across the planar surface of the ring and located in correspondence with leads of the TAB frame, alternating ones of the conductors have lower portions which extend down opposing sides of the sidebar; and
- means for clamping the TAB frame against the upper surface of the ring with sufficient force to maintain electrical contact between the conductors and the leads.

12. An apparatus as in claim 11, including a keeper means for maintaining the upper portion of each of said plurality of conductor means disposed normal to the perimeter across said adapter ring upper surface.

13. An apparatus as in claim 12, in which said keeper means is mechanically interlocked with said adapter ring means.

14. An apparatus as in claim 11, in which said lower portion of said plurality of conductor means is solder plated.

15. An apparatus as in claim 11, wherein said plurality of conductor means comprises flexible circuitry.

16. An apparatus as in claim 11, wherein said adapter ring includes contact passages extending from said upper surface to said lower surface; and each of said plurality of conductor means is located within one of said contact passages.

17. An apparatus as in claim 16, wherein said plurality of conductor means comprises flexible circuitry.

18. An apparatus as in claim 13, wherein said plurality of conductor means comprises flexible circuitry.

* * * * *